US012716920B2

(12) United States Patent
Splithof et al.

(10) Patent No.: US 12,716,920 B2
(45) Date of Patent: Aug. 25, 2026

(54) VOLTAGE AND CURRENT SENSE CIRCUITS FOR MEASURING A LOAD CONNECTED TO A POWER AMPLIFIER

(71) Applicant: GOODIX TECHNOLOGY (HK) COMPANY LIMITED, Hong Kong (CN)

(72) Inventors: Mike Hendrikus Splithof, Nijmegen (NL); Marco Berkhout, Nijmegen (NL)

(73) Assignee: GOODIX TECHNOLOGY (HK) COMPANY LIMITED, Hong Kong (CN)

( * ) Notice: Subject to any disclaimer, the term of this patent is extended or adjusted under 35 U.S.C. 154(b) by 174 days.

(21) Appl. No.: 18/742,617

(22) Filed: Jun. 13, 2024

(65) Prior Publication Data

US 2024/0329099 A1 Oct. 3, 2024

Related U.S. Application Data

(63) Continuation of application No. PCT/CN2022/138398, filed on Dec. 12, 2022.

(30) Foreign Application Priority Data

Dec. 14, 2021 (EP) .................................... 21214440

(51) Int. Cl.
*G01R 19/00* (2006.01)
*G01R 15/04* (2006.01)
*H03F 3/45* (2006.01)

(52) U.S. Cl.
CPC ......... *G01R 19/0023* (2013.01); *G01R 15/04* (2013.01); *H03F 3/45475* (2013.01)

(58) Field of Classification Search
CPC .................................................. G01R 19/0023
See application file for complete search history.

(56) References Cited

U.S. PATENT DOCUMENTS 5,703,490 A 12/1997 Kennedy
6,172,636 B1 1/2001 Murden
(Continued)

FOREIGN PATENT DOCUMENTS

CN 103986440 A 8/2014
CN 104348431 A 2/2015
(Continued)

OTHER PUBLICATIONS

International Search Report dated Feb. 22, 2023 issued in PCT/CN2022/138398.
(Continued)

*Primary Examiner* — Tung X Nguyen
(74) *Attorney, Agent, or Firm* — Scully, Scott, Murphy & Presser, P.C.

(57) ABSTRACT

Voltage sense circuit for measuring a load connected to a power amplifier, the load configured to receive a first and second voltage in opposite phase, the voltage sense circuit comprises a first input terminal coupled to the first voltage, a second input terminal coupled to the second voltage, a first voltage divider circuit comprising an input coupled to the first input terminal and an output coupled to the first output terminal, a second voltage divider circuit comprising an input coupled to the second input terminal and an output coupled to the second output terminal and a driver circuit comprising a first input configured to receive a reference voltage, a second input configured to receive a common mode signal of first and second voltage divider circuits, and an output to drive an output common mode voltage of the first and the second voltage divider circuits with the reference voltage.

20 Claims, 16 Drawing Sheets

(56) References Cited

U.S. PATENT DOCUMENTS

| | | | |
|---|---|---|---|
| 6,173,636 B1 | 1/2001 | Madrzak | |
| 9,431,978 B2 | 8/2016 | Huang | |
| 10,720,890 B1 | 7/2020 | Lin et al. | |
| 10,944,366 B2 | 3/2021 | Du et al. | |
| 11,099,589 B1 | 8/2021 | Laur et al. | |
| 11,480,987 B2 | 10/2022 | Laur et al. | |
| 2007/0120595 A1 | 5/2007 | Udupa | |
| 2011/0012677 A1* | 1/2011 | Dooper | H03F 3/2173 330/251 |
| 2014/0142879 A1 | 5/2014 | Lucchese | |
| 2014/0355790 A1* | 12/2014 | Panov | H03F 3/187 330/251 |
| 2015/0035598 A1 | 2/2015 | Huang | |
| 2017/0141743 A1 | 5/2017 | Berkhout et al. | |
| 2018/0069513 A1 | 3/2018 | Kumar | |
| 2020/0259463 A1 | 8/2020 | Lin et al. | |
| 2020/0287507 A1 | 9/2020 | Du et al. | |
| 2021/0091738 A1 | 3/2021 | Bako et al. | |
| 2021/0231710 A1 | 7/2021 | Sivakumar et al. | |
| 2021/0286390 A1 | 9/2021 | Laur et al. | |
| 2021/0344310 A1 | 11/2021 | Zanbaghi et al. | |
| 2021/0349488 A1 | 11/2021 | Laur et al. | |

FOREIGN PATENT DOCUMENTS

| | | |
|---|---|---|
| CN | 106851475 A | 6/2017 |
| CN | 111555726 A | 8/2020 |
| CN | 111654252 A | 9/2020 |
| CN | 112104371 A | 12/2020 |
| CN | 113014203 A | 6/2021 |
| CN | 113411058 A | 9/2021 |
| EP | 3171515 A1 | 5/2017 |

OTHER PUBLICATIONS

Berkhout, M. et al., “A 4Ω 2.65W Class-D Audio Amplifier With Embedded DC-DC Boost Converter, Current Sensing ADC and DSP for Adaptive Speaker Protection,” IEEE Journal of Solid-State Circuits (Dec. 12, 2013), vol. 48, No. 12, pp. 2952-2961, doi: 10.1109/JSSC.2013.2284692.

Texas Instruments Application note SLAA701A, https://www.ti.com/lit/an/slaa701a/slaa701a.pdf, chapter 2 (Oct. 1, 2016).

Binet, V. et al., “A fully integrated Class-D amplifier in 40nm CMOS with dynamic cascode bias and load current sensing,” ESSCIRC 2014—40th European Solid State Circuits Conference (ESSCIRC), Venice Lido, Italy, (Sep. 22, 2014), pp. 319-322, doi: 10.1109/ESSCIRC.2014.6942086.

“Driving Converters—Jan. 2000”, (Jan. 31, 2000), pp. 1-62, URL: http://people.ece.cornell.edu/wes/Projects/AD_notes/SEMINARS/DRIVING.PDF;1, (May 4, 2015), XP055187294 [Y] 1-7,14 * figure 6 *.

Rajput, Deepti, “Designing of an OP-amp using CMFB Technique”, (Jan. 2, 2017), pp. 1-10, URL: http://ijetsr.com/images/short_pdf/1484317765_deepti_ijetsr.pdf, (Aug. 22, 2022), XP055953471 [A] 8-13,15 * abstract *.

Hamburger et al., “Analog Circuit Design Volume Three”, Saint Louis, ISBN 978-0-12-800001-4, (Jan. 2, 2015), URL: https://www.analog.com/media/en/technical-documentation/application-notes/an105fa.pdf, (Aug. 22, 2022), XP055567797 [A] 8-13,15 * figures 120,121 *.

* cited by examiner

ADC
902
204
I_OP
I_ON
200
208
current interface
600
202
206
602
606
604
608
900
V_HSN
V_LSN
R_HSP
M_HSN
M_LSN
R_LSN
V_DDP
V_HSP
R_L
V_LSP
L_L
R_HSP
M_HSP
M_LSP
R_LSP

VOLTAGE AND CURRENT SENSE CIRCUITS FOR MEASURING A LOAD CONNECTED TO A POWER AMPLIFIER

CROSS-REFERENCE TO RELATED APPLICATIONS

This application is a continuation of International Application No. PCT/CN2022/138398, filed on Dec. 12, 2022, which claims priority to EP Patent Application No. 21214440.6 filed on Dec. 14, 2021. The disclosures of the aforementioned applications are hereby incorporated by reference in their entireties.

TECHNICAL FIELD

The disclosure relates to a voltage sense circuit for measuring a load connected to a power amplifier. The application further relates to a current sense circuit for measuring a load connected to a power amplifier and to a method of operating the voltage and current sense circuits to measure a load connected to a power amplifier.

BACKGROUND

A typical configuration for the output stage of a power amplifier is the bridge-tied load (BTL), which is shown in FIG. 1A and in which both sides of a load, such as a loudspeaker, are being driven by two outputs in opposite phase. In this way, the current through the load can flow in two opposite directions. Typically, the power amplifier is operated in class-D, which means that the output transistors are switched such that the output voltages are modulated square waves with a typical fundamental frequency around 500 Kilohertz's. Ferrite beads or inductors may be placed between the actual amplifier outputs and the speaker to reduce electromagnetic emission and/or to filter the high-frequency residue due to modulation.

For various reasons, such as for instance for providing speaker protection, it may be desired to measure the impedance of the load connected to the power amplifier. This can be achieved by simultaneously measuring the voltage across the load and the current through the load. For instance, if the load is a speaker, by measuring the load, speaker protection can be provided as the impedance of a speaker provides information about its voice coil temperature, which, in turn, is a measure for the excursion of the speaker membrane as disclosed in "A 4Ω 2.65 W Class-D Audio Amplifier with Embedded DC-DC Boost Converter, Current Sensing ADC and DSP for adaptive speaker protection", by Marco Berkhout, Lûtsen Dooper and Benno Krabbenborg, in IEEE Journal of Solid-State Circuits, Vol 48, No 12, pp. 2952-2961, 2013.

The measured voltage and current are typically converted to a digital value, which allows further signal processing in the digital domain. Sigma-delta data converters provide a very cost-effective solution for this.

Measuring the voltage across the load can be achieved by observing the difference between the voltages $V_{SP}$ and $V_{SN}$ at both sides of the load as shown in FIG. 1B. However, the measurement of said voltage is affected by the large common mode voltage swing that appears on the output nodes of the amplifier.

Measuring the current through the load can be accomplished by adding a known measurement resistor $R_{SENSE}$ in series with the load, as shown in FIG. 1C, and by measuring the differential voltage across said known measurement resistor. For power efficiency reasons, the impedance of the measurement resistor shall be small compared to the load, typically in the order of 1% of the load or smaller. If the measurement resistor is placed between the outputs of the amplifier and the load, the measurement resistor will experience the same common mode voltage swing as the load, but the differential signal to be observed is much smaller than the voltage across the load. In other words, the common mode rejection requirements for the current interface circuitry will be extremely challenging if this sensing scheme is adopted. This will be at the expense of chip area and/or current consumption.

Alternatively, the measurement resistor(s) can be placed at a different location in the current path. A popular solution is to place two measurement resistors in series with the sources of the low-side output transistors as shown in FIG. 1D. Since one leg of each resistor is grounded, the common mode issue is adequately tackled in this way. As far as the AD modulation scheme is concerned, there are two possible circuit states:

1. $M_{HSP}$ and $M_{LSN}$ are simultaneously conducting. The current through $R_L$ will flow through $R_{LSN}$ as well (note: the current can still have both polarities due to the presence of an inductor in series with the load)
2. $M_{HSN}$ and $M_{LSP}$ are simultaneously conducting. The current through $R_L$ will flow through $R_{LSP}$ as well.

Now, by observing the differential voltage $V_{LSP}$-$V_{LSN}$, an adequate measure for the load current can be obtained.

With the BD modulation scheme, however, the measurement is complicated by the fact that there are four possible circuit states. During every PWM period, the output stage will run through three of these states as described below and shown in FIG. 1E.

1. For a positive signal half of the audio signal ($V_{SP}$>$V_{SN}$), the circuit will successively run through these operation states:

state I: both $V_{OP}$ and $V_{ON}$ low
state III: $V_{OP}$ high and $V_{ON}$ low
state II: both $V_{OP}$ and $V_{ON}$ high
state III: $V_{OP}$ high and $V_{ON}$ low
and return to state I. This is shown in the upper part of FIG. 1E.

2. For a negative signal half of the audio signal ($V_{SP}$<$V_{SN}$), the circuit will operate in these states subsequently:

state I: both $V_{OP}$ and $V_{ON}$ low
state IV: $V_{OP}$ low and $V_{ON}$ high
state II: both $V_{OP}$ and $V_{ON}$ high
state IV: $V_{OP}$ low and $V_{ON}$ high
and return to state I. This is shown in the 1 part of FIG. 1E.

Note that in state I, the load current is sensed by two resistors. In state III and IV, the load current is sensed by one resistor. Finally, in state II, the load current is not sensed at all. This is obviously a source of distortion and requires additional design measures to make the system work. In previous amplifiers, compensation has been used reduce distortion, but has limited performance. Alternatively, including high-side sense resistors in the measurement is a fundamental solution for this problem. FIG. 1F shows how the situation changes when high-side sense resistors are also included in the sensing scheme.

Adding high-side sense resistors solves the distortion issue with BD modulation since the load current is being sensed by two sense resistors, irrespective in which state the output stage operates.

FIG. 1G shows a current interface, which is a part of the application, and whose task it is to combine four sense voltages $V_{HSN}$, $V_{HSP}$, $V_{LSP}$ and $V_{LSN}$ into a signal that can be handled by the ADC.

"A fully Integrated Class-D Amplifier in 40 nm CMOS with Dynamic Cascode Bias and Load Current Sensing", by Binet et al, ESSCIRC2014-40th European Solid-State Circuits Conference discloses an implementation of a current interface as shown in FIG. 1H. The operation of this circuit is briefly as follows. The output transistors of the bridge have sense resistors in series with their sources ($R_{1HP}$, $R_{1HN}$, $R_{1LP}$, $R_{1LN}$). A total of four local amplifiers together with resistors $R_{2HP}$ etc. are configured as VI converters to actively generate scaled copies of the sensed currents. Deliberately added offset sources (called OffsetHP etc. . . . ) shall take care that the currents through $R_{2HP}$ etc. will not change polarity, even when the current through $R_{1HP}$ etc. changes direction. Via additional current mirrors, four scaled currents (two per bridge-half) are subsequently summed in the current domain and will leave the circuit at nodes $I_{OUTP}$ and $I_{OUTN}$.

Since the signals across the sense resistors are small, it is obvious that the four amplifiers must be designed for low-noise, which will be at the expense of power and chip area. Mismatch of the offset sources and current mirrors adds to the mismatch performance of the circuit, which must be compensated for by improving the matching of the resistors $R_{2HP}$ and $R_{1HP}$ etc. Again, this will cost additional chip area. Finally, it must be noted that due to the use of current mirrors, the scaled copies of the sense currents will flow in multiple branches. This will lead to extra power consumption.

Furthermore, regarding the voltage interface, the differential voltage across the load can become as large as the supply voltage of the power stage. This is generally much too large to be handled by an Analog to Digital converter (ADC) that might be attached to $V_{op}$ and $V_{on}$. Therefore, the voltage interface must also incorporate attenuation. Also, the supply voltage of the output stage is often modulated with the (audio) signal to further increase efficiency (class-DG operation). This implies that the common mode voltage will vary along with the audio signal. Additionally, due to the class-D operation, the output common mode voltage contains large high-frequency components. Therefore, common mode rejection is an important requirement for the voltage interface. Finally, the output common mode voltage level of the voltage interface shall fit conveniently between the supply rails of the ADC.

A known technique for rejecting common mode in an amplifier is to use two matched voltage dividers as voltage interface wherein the two matched voltage dividers have zero common mode rejection as shown in FIG. 1I. In FIG. 1I, voltage level shifting is required to make the signal suitable for the ADC. However, this introduces additional noise and distortion.

Binet et al, "A fully Integrated Class-D Amplifier in 40 nm CMOS with Dynamic Cascode Bias and Load Current Sensing", ESSCIRC2014-40th European Solid-State Circuits Conference discloses a current interface wherein the output transistors of the bridge have sense resistors in series with their sources and a total of four local amplifiers together with the sense resistors are configured as converters to actively generate scaled copies of the sensed currents. Deliberately added offset sources shall take care that the currents through the sense resistors will not change polarity, even when the current through said resistors changes direction. Via additional current mirrors, four scaled currents (two per bridge-half) are subsequently summed in the current domain and will leave the circuit at the output nodes. Since the signals across the sense resistors are small, the four amplifiers must be designed for low-noise, which will be at the expense of power and chip area. Mismatch of the offset sources and current mirrors adds to the mismatch performance of the circuit, which must be compensated for by improving the matching of the sense resistors, which again will cost additional chip area. Finally, that due to the use of current mirrors, the scaled copies of the sense currents will flow in multiple branches, which will lead to extra power consumption.

It would be advantageous to implement a low cost efficient voltage and current sensing circuits for measuring a load connected to an amplifier that still performs well in terms of noise and distortion.

SUMMARY

The application relates to a voltage sense circuit for measuring a load connected to a power amplifier wherein the load is configured to receive a first voltage at a first end and a second voltage at a second end, wherein the first and the second voltages are in opposite phase, wherein the voltage sense circuit comprises a first input terminal coupled to the first voltage, a second input terminal coupled to the second voltage, a first output terminal, a second output terminal, a first voltage divider circuit comprising an input coupled to the first input terminal and an output coupled to the first output terminal, a second voltage divider circuit comprising an input coupled to the second input terminal and an output coupled to the second output terminal and a driver circuit comprising a first input configured to receive a reference voltage, a second input configured to receive a common mode signal of the first and the second voltage divider circuits, and an output configured to drive an output common mode voltage of the first and the second voltage divider circuits with the reference voltage. This allows rejecting the common mode variations such that a differential voltage is converted into a current with an amplitude and a common mode voltage level that can be directly handled by an ADC. For instance, the resulting output current can be directly integrated by the first integrator stage of the sigma-delta converter attached.

The second input of the driver circuit may be connected to the output of the driver circuit. This provides a suitable connection that allows rejecting common mode variations.

Each of the first and second voltage dividers may comprise a pair of resistors wherein each of the pair of resistors comprises a first end and a second end and wherein the first ends of the pair of resistors may be respectively connected to the first and second output terminals and wherein the second ends of the pair of resistors may be connected to each other. This is a very efficient implementation that reduces noise and distortion. In this way, the resulting output current can be directly integrated by the first integrator stage of a sigma-delta converter attached to the voltage sense circuit.

Alternatively, the first and second voltage dividers may be implemented using voltage sources or in any other suitable manner.

The voltage second input and the output of the driver circuit may be connected to the second ends of the pair of resistors. This is a suitable connection to reject common mode variations. However, the voltage second input and the output of the driver circuit may be coupled to the first and second voltage dividers in any suitable way.

The driver circuit may comprise a first and a second resistors connected in series between the first and the second output terminals such that a first end of the first resistor may be coupled to the first output terminal, a second end of the first resistor may be coupled to a first end of the second resistor and a second end of the second resistor may be coupled to the second output terminal, and wherein the second input of the driver circuit may be coupled to the first end of the second resistor. This is a very efficient implementation of the driver circuit that allows common mode rejection at the output of the voltage sense circuit. However, the driver circuit may be implemented in any other suitable way. This is a very efficient implementation using resistors that reduces noise and distortion.

The driver circuit may comprise a first and a second output resistors $R_{3p}$-$R_{3n}$ wherein the first output resistor $R_{3p}$ may be connected between the first output terminal $I_{op}$ and the first end of the first resistor $R_{2p}$ and the second output resistor $R_{3n}$ may be connected between the second output terminal $I_{on}$ and the second end of the second resistor $R_{2n}$. In this way, the physical quantity that the ADC must handle is current and therefore, the same ADC can be connected to the voltage sense interface and to a current sense interface in order to measure both current and voltage to calculate the load. I.e., by adding the first and the second output resistors $R_{3p}$-$R_{3n}$, which are the first stage of the ADC, the output variable of the voltage sense circuit is current. This would be beneficial since both the current and the voltage sense ADCs can be then identical circuits, both converting current to digital.

The application further relates to a current sense circuit for measuring a load connected to a power amplifier wherein the load is configured to receive a first voltage $V_{ip}$ at a first end and a second voltage $V_{in}$ at a second end, wherein the first and the second voltages are in opposite phase, wherein the current sense circuit comprises a first input terminal coupled to the first voltage $V_{HSN}$, a second input terminal coupled to the second voltage $V_{HSP}$, a third input terminal coupled to the third voltage $V_{LSN}$, a fourth input terminal coupled to the fourth voltage $V_{LSP}$, a first output terminal $I_{op}$, a second output terminal $I_{on}$, and a common mode loop circuit comprising a first input, a second input, a third input and an output wherein the first and the second inputs are configured to receive a common mode voltage at the first and second output terminals $I_{op}$ and $I_{on}$, the third input is configured to receive a reference voltage, and to generate a control signal at the output to switch the current sense circuit such that the common mode voltage equals the reference voltage. In this way, two high-side sense voltages and two low-side sense voltages will be converted to a current at a common mode voltage level suitable for an ADC. For the high-side voltages, which are defined with respect to a supply voltage (and which can contain disturbances), a differential amplifier is being used to reject the common supply variation. It is an important feature that while a differential amplifier is being used for the high-side voltages, the differential amplifier is not needed for the low-side voltages. This is good for noise and distortion. Furthermore, while a common mode loop is used to achieve the suitable output common mode voltage level, this voltage is replicated to the high-side sense resistors thereby re-using the branch currents, which is power and area efficient. The conversion and addition operations are combined such that the resulting output current is directly integrated by the first integrator stage of the sigma-delta converter attached. The application demonstrates simplest possible implementation in which a minimum amount of circuit elements contribute to output noise, mismatch and distortion.

The current sense circuit may further comprise a differential mode loop circuit comprising a first input and a second input and an output wherein the first and the second inputs are configured to receive a voltage difference and generate a control signal to keep the voltage difference equal to zero.

The current sense circuit may comprise a first transistor $M_1$ comprising a source, a gate and a drain, a second transistor $M_2$ comprising a source, a gate and a drain, and a first, second, third and fourth conversion resistors comprising a first end and a second end wherein the first end of the first, second, third and fourth conversion resistors are respectively coupled to the first, second, third and fourth input terminals, and the second end of the first resistor is coupled to the first input of the differential mode loop circuit and to the source of the first transistor $M_1$, the second end of the second resistor is coupled to the second input of the differential mode loop circuit and to the source of the second transistor $M_2$, the second end of the third resistor is coupled to the first input of the common mode loop circuit and to the drain of the first transistor $M_1$, the second end of the fourth resistor is coupled to the second input of the common mode loop circuit and to the drain of the second transistor $M_2$, and the control signals generated by the common mode loop circuit and the differential mode loop circuit control the gates of the first transistor $M_1$ and the second transistor $M_2$. This is a very efficient implementation.

The application also relates to a method of operating a current sense circuit and/or a method of operating a voltage sense circuit.

The person skilled in the art will understand that the features described above may be combined in any way deemed useful. Moreover, modifications and variations described in respect of the system may likewise be applied to a method.

BRIEF DESCRIPTION OF THE DRAWINGS

In the following, aspects of the application will be elucidated by means of examples, with reference to the drawings. The drawings are diagrammatic and are not drawn to scale.

DETAILED DESCRIPTION

Figure 1A:
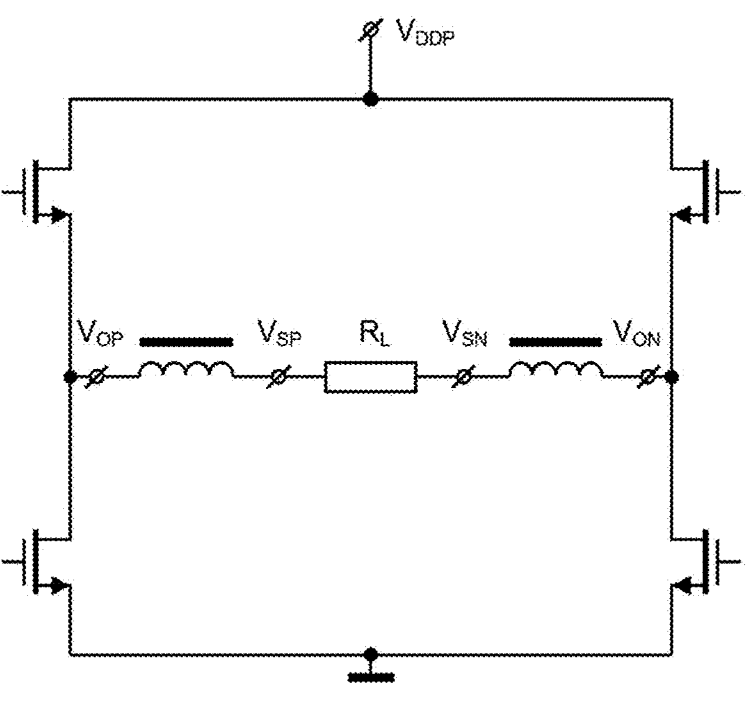
FIGS. 1A-1I show known current or voltage sense circuits.
Figure 1B:
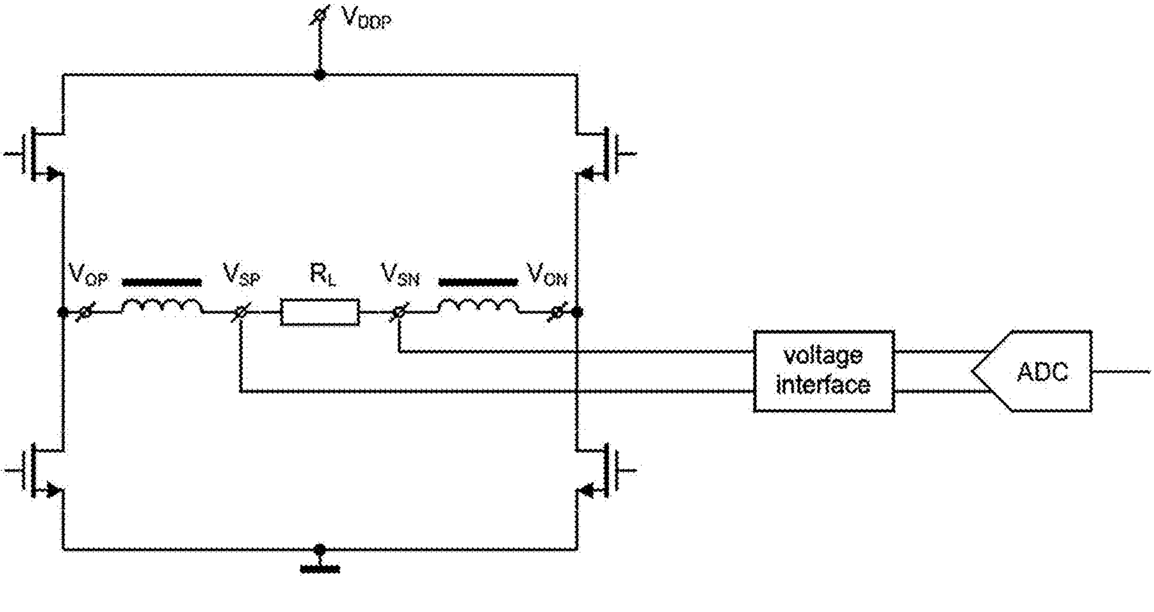
Figure 1C:
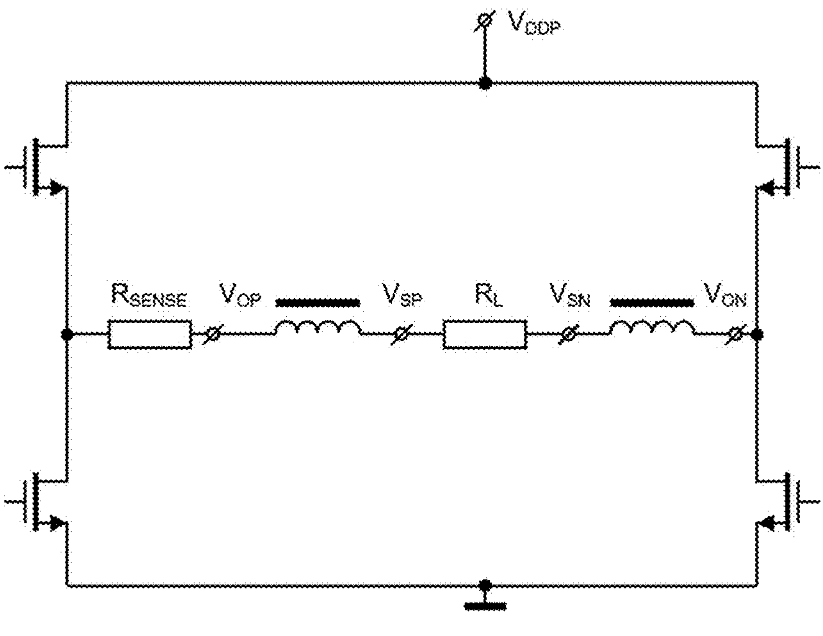
Figure 1D:
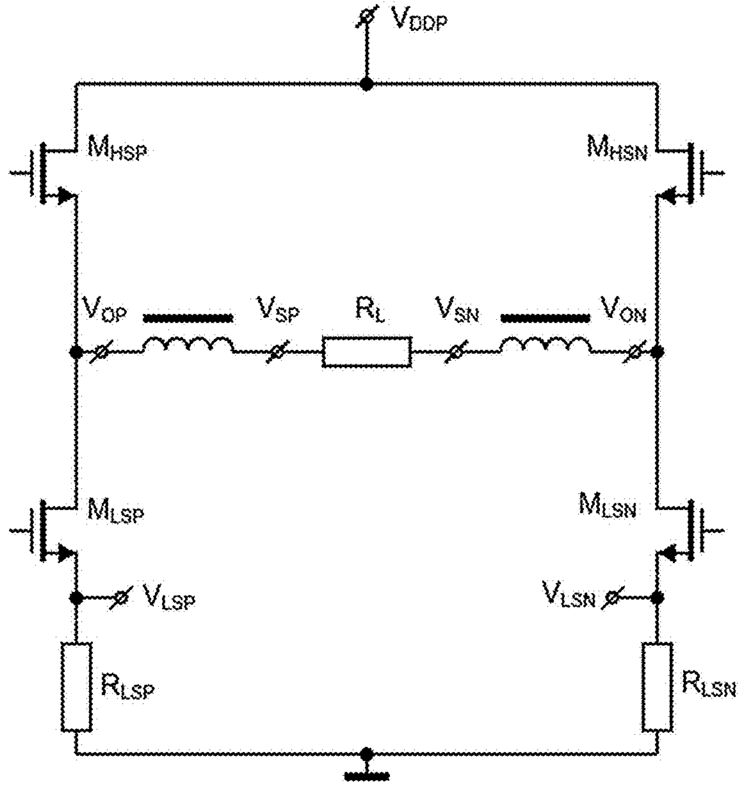
Figure 1E:
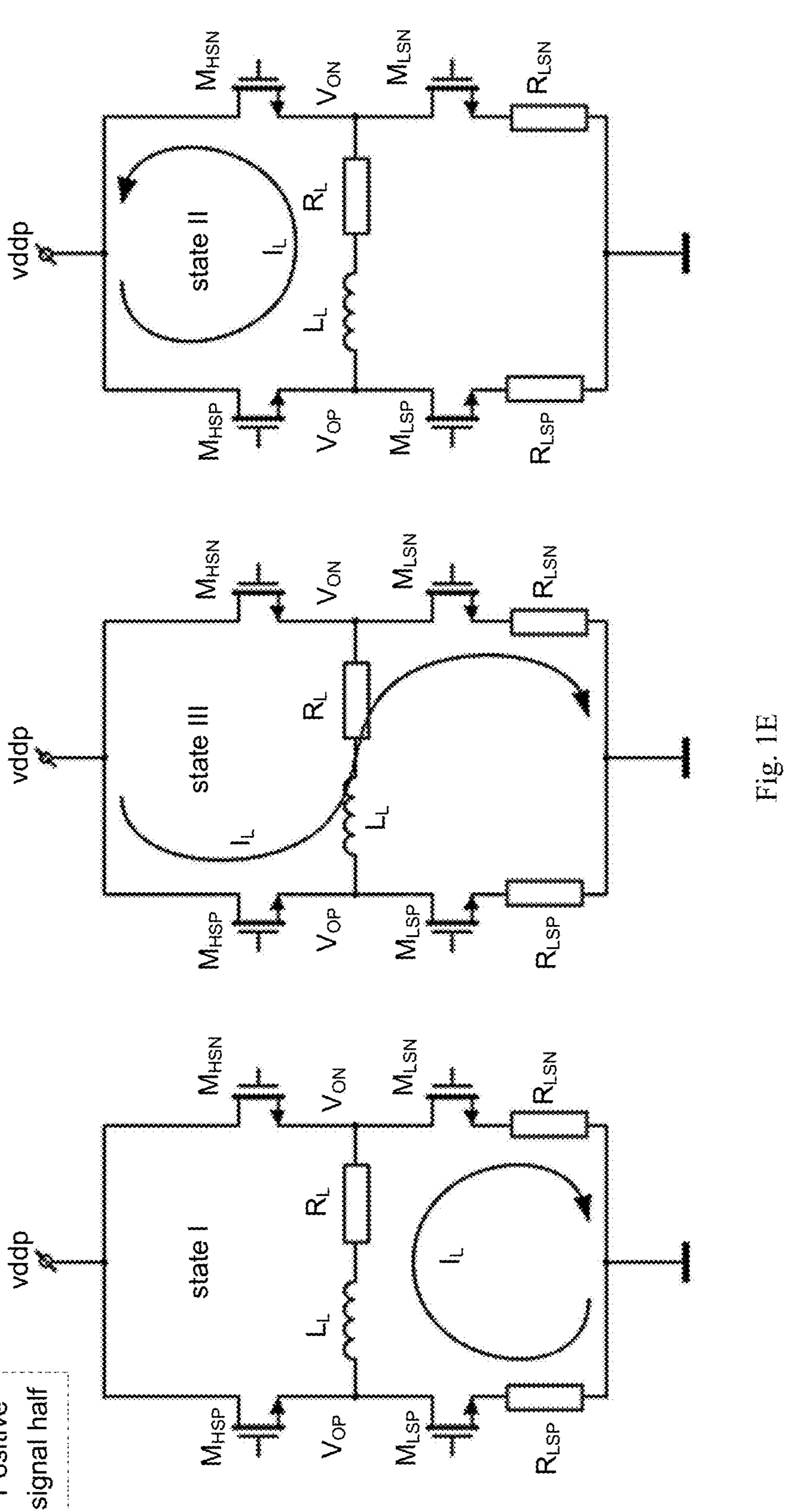
Figure 1E:
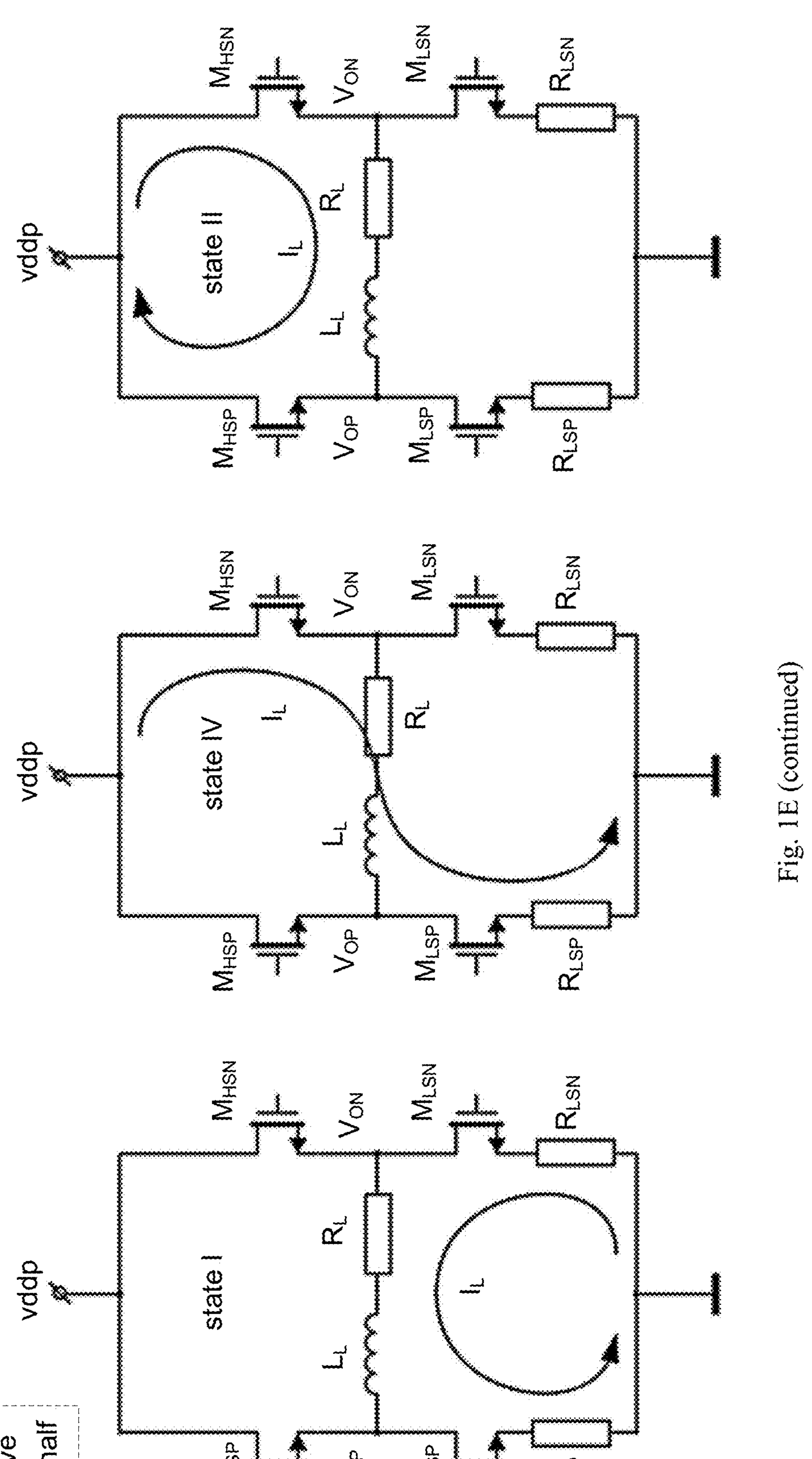
Figure 1F:
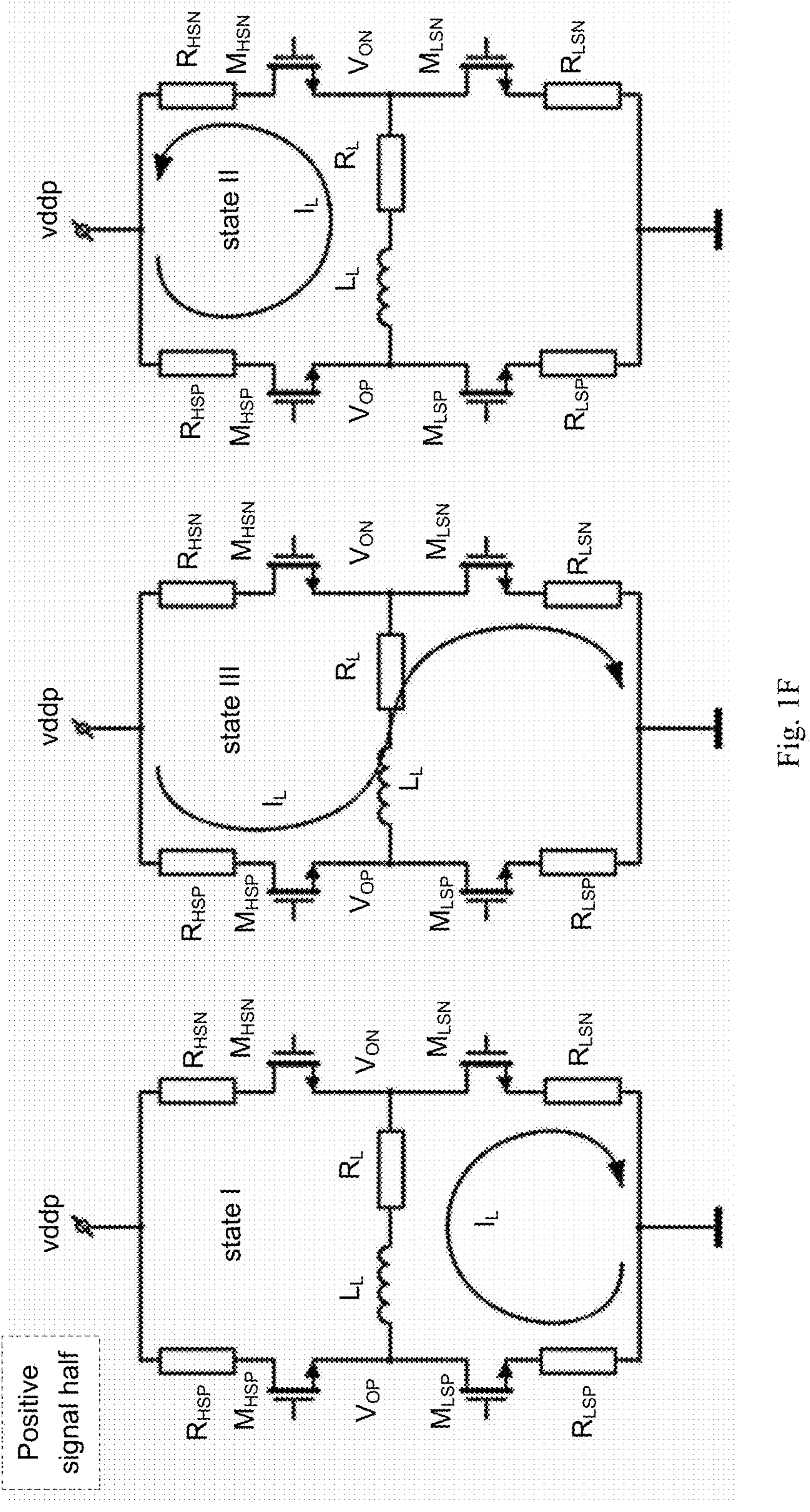
Figure 1F:
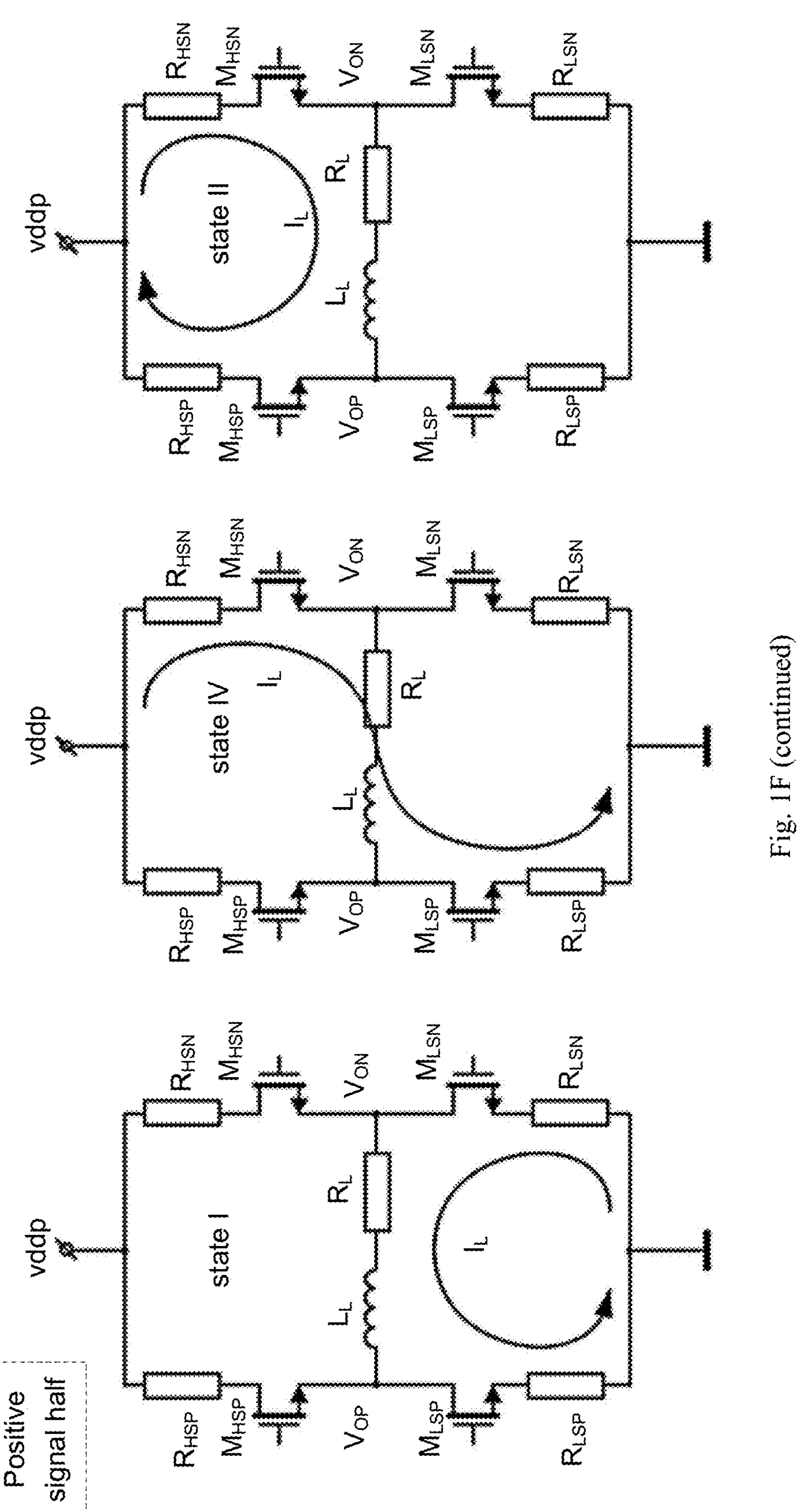
Figure 1G:
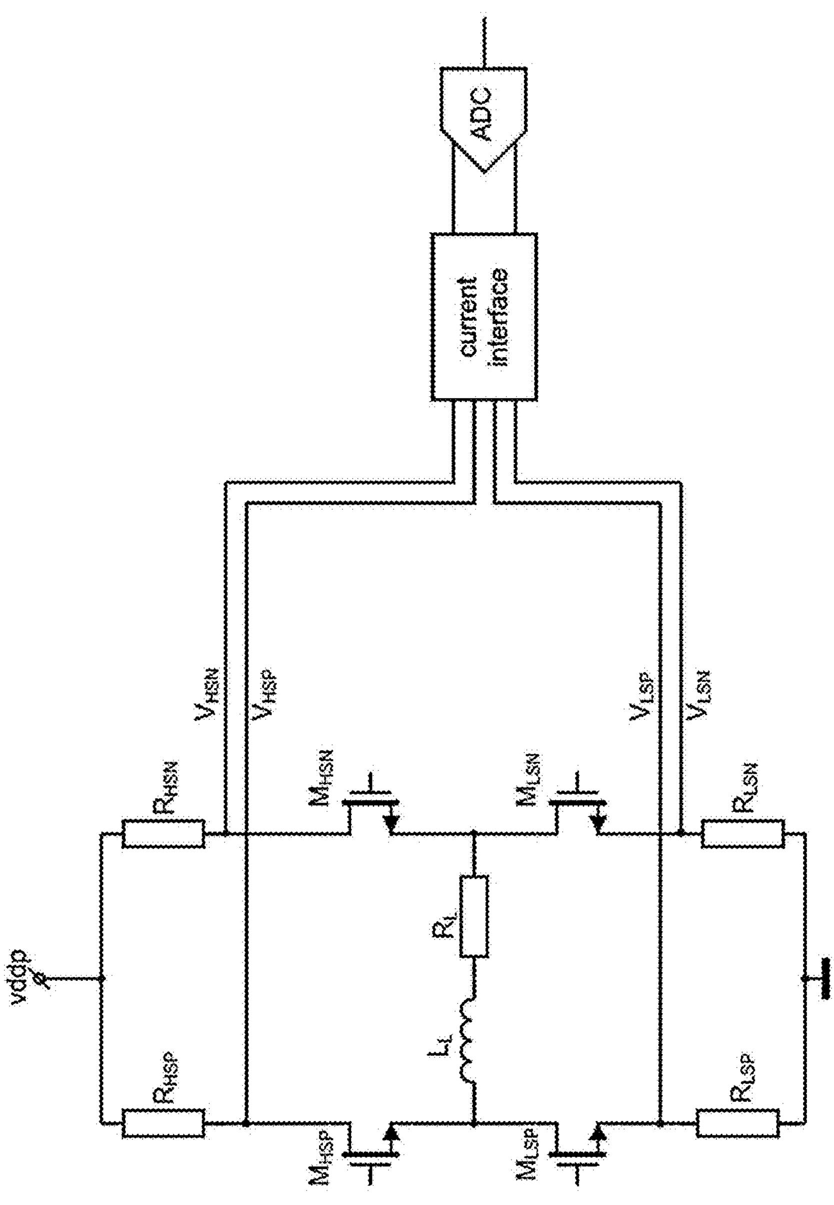
Figure 1H:
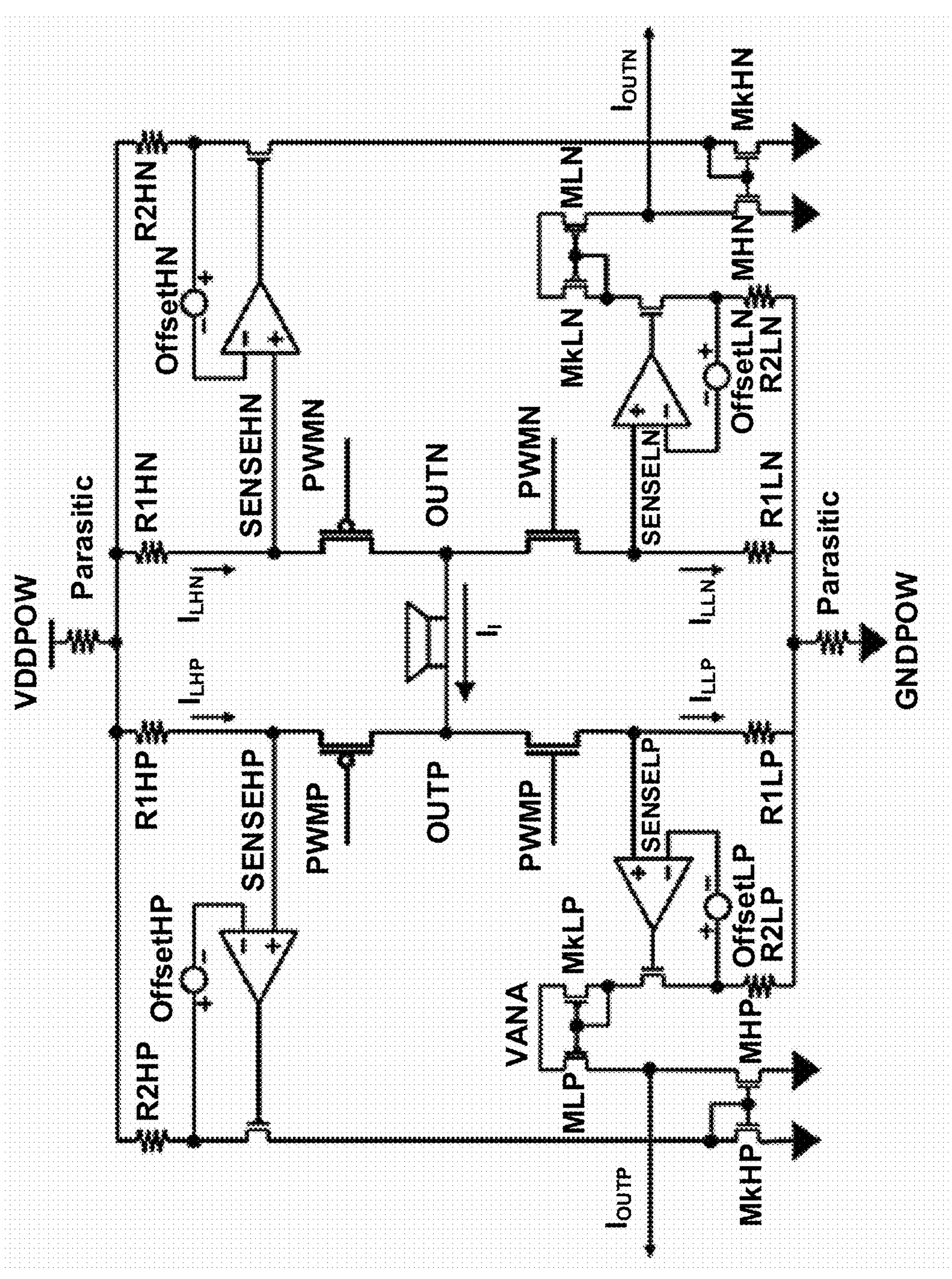
Figure 1I:
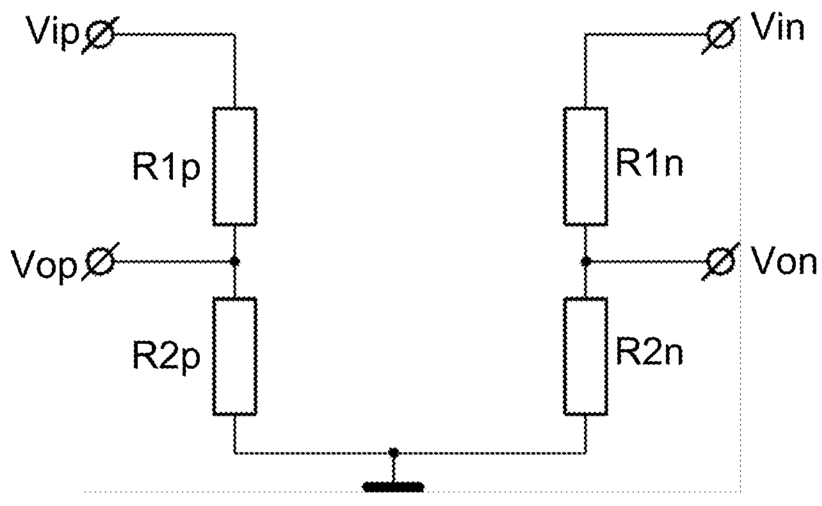
Figure 2:
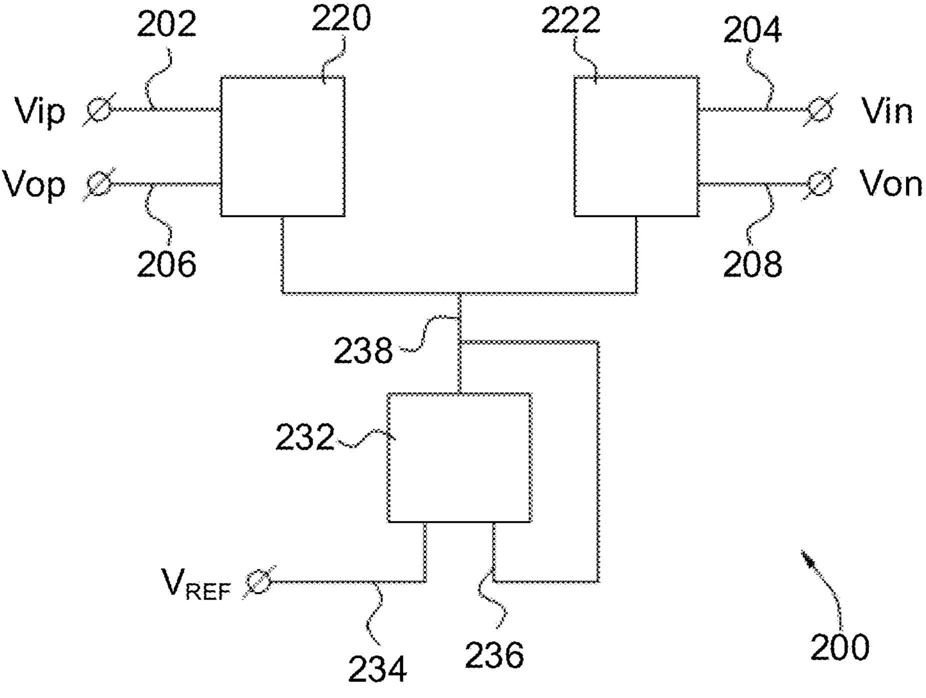
FIG. 2 shows a voltage sense circuit according to an embodiment of the application.

FIG. 2 shows a voltage sense circuit 200 according to a first embodiment of the application. The voltage sense circuit 200 of FIG. 2 comprises a first input terminal 202, a second input terminal 204, a first output terminal 206 and a second output terminal 208. The first input terminal 202 of the voltage sense circuit 200 of FIG. 2 is configured to receive a first input voltage $V_{ip}$, the second input terminal 204 is configured to receive a second input voltage $V_{in}$, the first output terminal 206 is configured to provide a first output voltage $V_{op}$, and the second output terminal 208 is configured to provide a second output voltage $V_{on}$.

The voltage sense circuit 200 of FIG. 2 comprises further a first voltage divider circuit 220 and a second voltage divider circuit 222. The first voltage divider circuit 220 comprises an input and an output wherein the input is coupled to the first input terminal 202 of the voltage sense circuit and the output is coupled to the first output terminal 206. The second voltage divider circuit 222 comprises an input and an output wherein the input is coupled to the second input terminal 204 and the output is coupled to the second output terminal 208.

The voltage sense circuit 200 of FIG. 2 comprises further a driver circuit 232 wherein the driver circuit 232 comprises a first input 234, a second input 236, and an output 238. The first input 234 of the driver circuit 232 is configured to receive a reference voltage, the second input 234 is coupled to the first voltage divider circuit 220 and to the second voltage divider circuit 222 and is configured to receive a common mode signal, and the output 238 is coupled to the first and the second voltage divider circuits and configured to drive an output common mode voltage of the first and the second voltage divider circuits with the reference voltage.

The voltage sense circuit 200 shown in FIG. 2 may be used to measure a load connected to a power amplifier wherein the load is configured to receive the first voltage ($V_{ip}$) at a first end of the load and the second voltage ($V_{in}$) at a second end of the load, wherein the first and the second voltages are in opposite phase.

In presence of large common mode voltage variations, a differential voltage is converted into a current with an amplitude and a common mode voltage level that can be conveniently handled by an ADC thereby rejecting the common mode variations mentioned. The resulting output current can be directly integrated by the first integrator stage of a sigma-delta converter attached.

Figure 3:
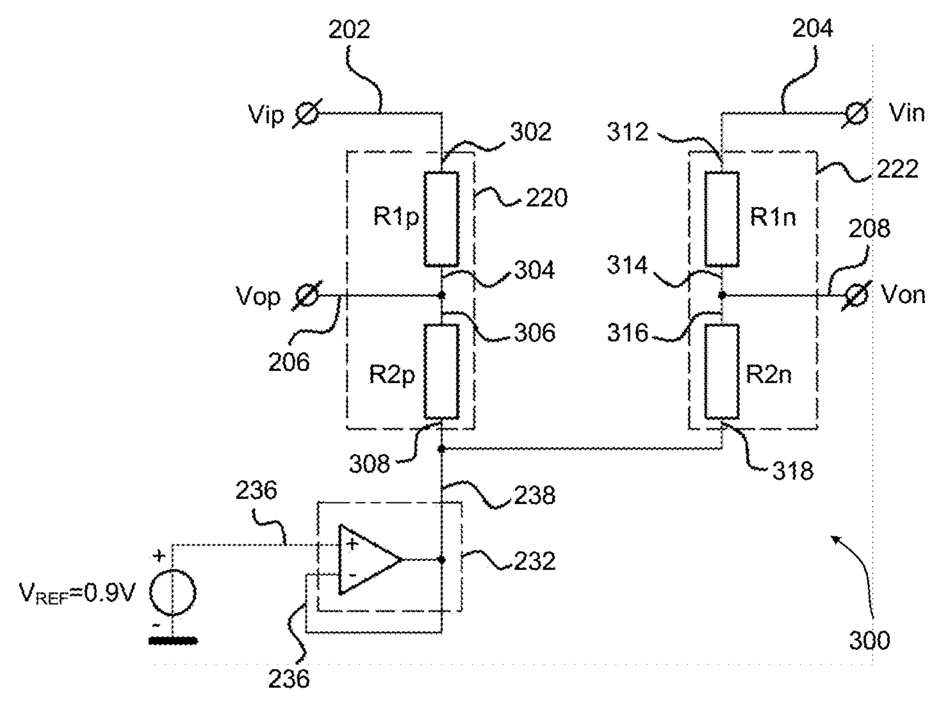
FIG. 3 shows a voltage sense circuit according to another embodiment of the application.

FIG. 3 shows a voltage sense circuit 300 according to a further embodiment of the application wherein the same reference numbers as in FIG. 2 have been used to indicate the same elements. The first voltage divider 220 of FIG. 3 comprises a first resistor $R_{1p}$ and a second resistor $R_{2p}$ wherein the first resistor $R_{1p}$ comprises a first end 302 and a second end 304 and the second resistor $R_{2p}$ comprises a first end 306 and a second end 308. The first end 302 of the first resistor $R_{1p}$ is connected to the first input terminal 202 of the voltage sense circuit 300, the second end 304 of the first resistor $R_{1p}$ is connected to the first output terminal 206 of the voltage sense circuit 300, and to the first end 306 of the second resistor $R_{2p}$. The second end 308 of the second resistor $R_{2p}$ is connected to the second input 236 and to the output 238 of the driver circuit 232.

The second voltage divider 222 shown in FIG. 3 comprises a third resistor $R_{1n}$ and a fourth resistor $R_{2n}$ wherein the third resistor $R_{1n}$ comprises a first end 312 and a second end 314, and the fourth resistor $R_{2n}$ comprises a first end 316 and a second end 318. The first end 312 of the third resistor $R_{1n}$ is connected to the second input terminal 204, the second end 314 of the third resistor $R_{1n}$ is connected to the second output terminal 208 of the voltage sense circuit 300 and to the first end 316 of the fourth resistor $R_{2n}$. The second end 318 of the fourth resistor $R_{2n}$ is connected to the second output 236 of the driver circuit 232, to the output 238 of the driver circuit 232 and to the second end 308 of the second resistor $R_{2p}$.

In this way, the output common mode voltage of the voltage sense circuit 300 shown in FIG. 3 is not so close to ground, which is not convenient for an ADC that might be attached to the first and second output terminals 206 and 208. Furthermore, common mode rejection at the output of the voltage sense circuit 300 is provided. The common ground node between the second end 308 of the second resistor $R_{2p}$ and the second end 318 of the fourth resistor $R_{2n}$ could be replaced by a voltage source, or by a buffer that drives this common ground node with a convenient voltage. In the example shown in FIG. 3, the first and second outputs $V_{op}$ and $V_{on}$ will be around 0.9 Volts, which is convenient if the ADC is supplied by 1.8 Volts with respect to ground. However, this is not limiting and the first and second outputs $V_{op}$ and $V_{on}$ may have any suitable value.

Figure 4:
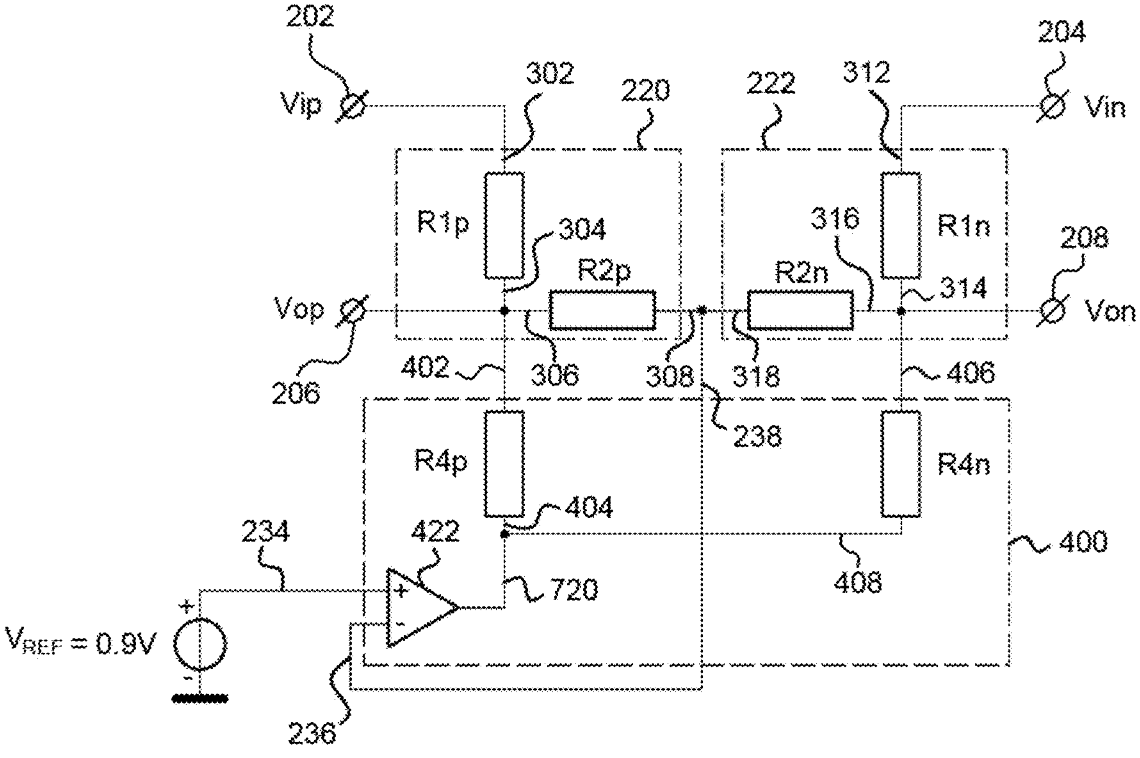
FIG. 4 shows a voltage sense circuit according to further embodiment of the application.

FIG. 4 shows a further embodiment according to the application wherein the driver circuit 400 further comprises a first resistor $R_{4p}$ and a second resistor $R_{4n}$ compare to the driver circuit 232 shown in FIG. 3. The first resistor $R_{4p}$ comprises a first end 402 and a second end 404. The second resistor $R_{4n}$ comprises a first end 406 and a second end 408. The first end 402 of the first resistor $R_{4p}$ of the driver circuit 400 is connected to the first output terminal 206, the second end 408 of the second resistor $R_{4n}$ is connected to the second output terminal 208, and the second end 404 of the first resistor $R_{4p}$ is connected to the first end 406 of the second resistor $R_{4n}$ and to an output 420 of an amplifier 422.

This allows to reject input common mode voltage variations. The loop around the amplifier takes care that the node between the second resistor $R_{2p}$ and the fourth resistor $R_{2n}$ will follow the reference voltage that is offered at the non-inverting input of the amplifier. Since there is no low-ohmic path to ground between the second resistor $R_{2p}$ and the fourth resistor $R_{2n}$, the current flowing through the second resistor $R_{2p}$ must be equal to the current in current flow through the fourth resistor $R_{2n}$. Therefore, any positive excursion in $V_{op}$ must be accompanied by an equal negative excursion in $V_{on}$. This implies that the output common mode level, $(V_{op}+V_{on})/2$, remains equal to the reference voltage. Any variation in the input common mode voltage will lead to increased common mode currents through the first resistor $R_{1p}$ and the second resistor $R_{1n}$ which will be consumed by the output 420 of the amplifier 422 via the first resistor $R_{4p}$ and the second resistor $R_{4n}$ of the driver circuit 400. Common mode rejection is achieved in this way.

Figure 5:
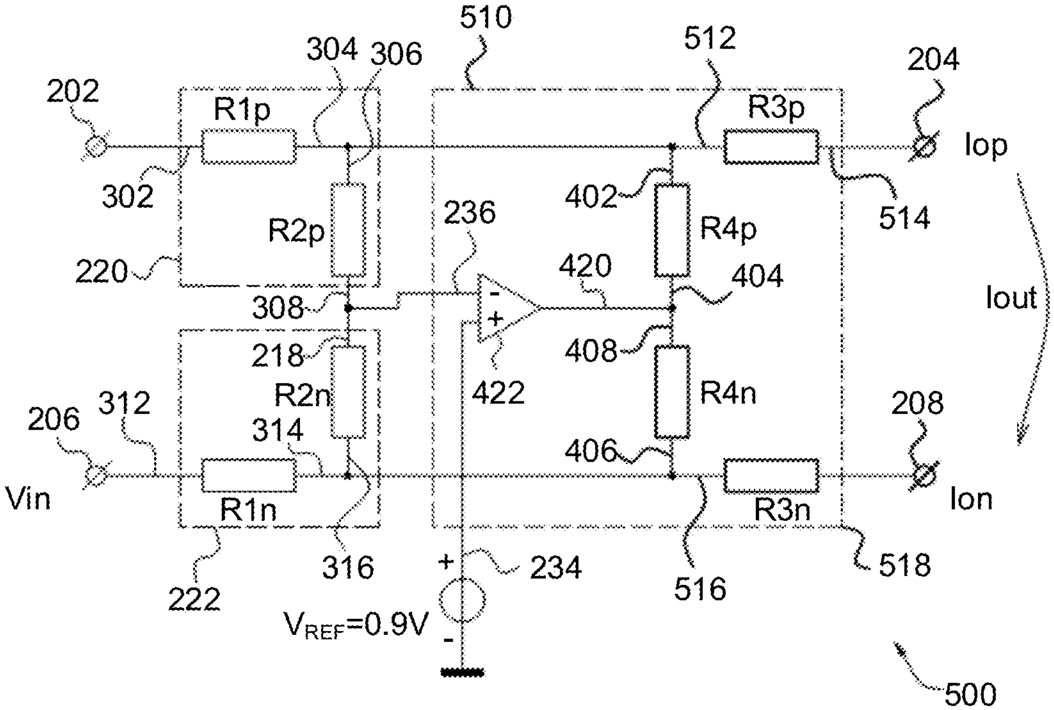
FIG. 5 shows a voltage sense circuit according to another further embodiment of the application.

FIG. 5 shows a further embodiment according to the application wherein the driver circuit 510 comprises a first output resistor $R_{3p}$ and a second output resistor $R_{3n}$ compared to the driver circuit 400 of FIG. 4. The first output resistor $R_{3p}$ of the driver circuit 510 comprises a first end 512 and a second end 514 and the second output resistor $R_{3n}$ of the driver circuit 510 comprises a first end 516 and a second end 518. The second end 514 of the first output resistor $R_{3p}$ of the driver circuit 510 is connected to the first output terminal 204 and the first end of the first output resistor $R_{3p}$ of the driver circuit 510 is connected to the first end 402 of the first resistor $R_{4p}$. The second end 518 of the second output resistor $R_{3n}$ of the driver circuit 510 is connected to the second output terminal 208 and the first end 516 of the second output resistor $R_{3n}$ of the driver circuit 510 is connected to the first end 406 of the second resistor $R_{4n}$. The first output terminal 204 and the second output terminal 206 of the voltage sense circuit of FIG. 5 are coupled together. In this way, the physical quantity that is handled by an ADC connected to the voltage sense circuit of FIG. 5 is a current, as the differential voltages between the first output terminal 204 and the second output terminal 206 deliver a current due to the use of the first output resistor $R_{3p}$ and a second output resistor $R_{3n}$ and the coupling of the first and second output terminals.

Figure 6:
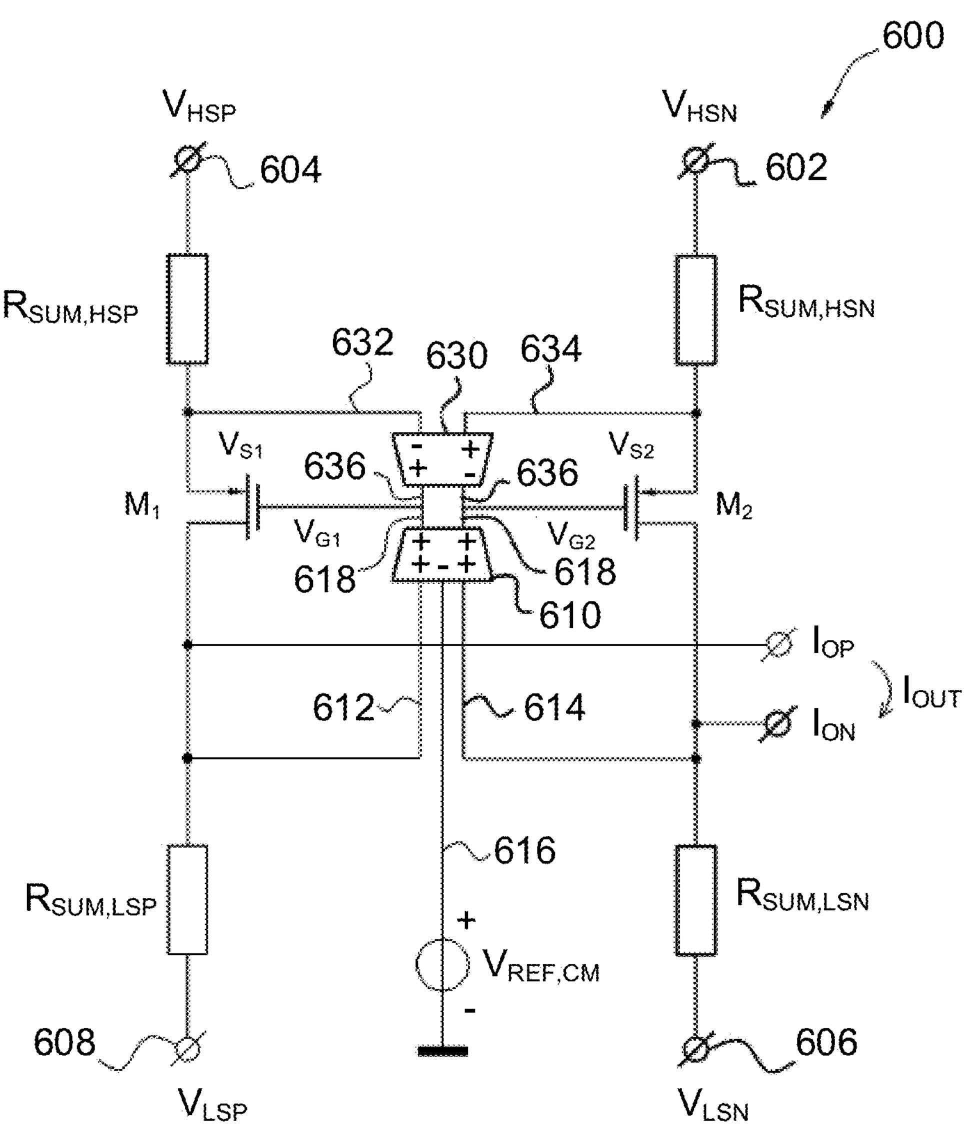
FIG. 6 shows a current sense circuit according to an embodiment of the application.

FIG. 6 shows a current sense circuit 600 according to an embodiment of the application. The current sense circuit 600 comprises a first input terminal 602 coupled to a first voltage $V_{HSN}$, a second input terminal 604 coupled to the second voltage $V_{HSP}$, a third input terminal 606 coupled to the third voltage $V_{LSN}$, a fourth input terminal 608 coupled to a fourth voltage $V_{LSP}$, a first output terminal $I_{op}$ a second output terminal $I_{on}$, and a common mode loop circuit 610. The common mode loop circuit 610 comprises a first input 612, a second input 614, a third input 616 and an output 618. The first and the second inputs of the common mode loop circuit 610 are respectively configured to receive a common mode voltage at the first and second output terminals $I_{op}$ and $I_{on}$. The third input 616 is configured to receive a reference voltage. In this way, the common mode loop circuit 610 is configured to generate a control signal at its output 618 to switch a first transistor $M_1$ and a second transistor $M_2$ such that the common mode voltage equals the reference voltage. The current sense circuit 600 further comprises a differential mode loop circuit 630 comprising a first input 632 and a second input 634 and an output 636 wherein the first and the second inputs 632 and 634 are configured to receive a voltage difference such that differential mode loop circuit 630 generates a control signal to control the first transistor $M_1$ and the second transistor $M_2$ in order to keep the voltage difference equal to zero. The goal of the current sense interface of FIG. 6 is to combine four sense voltages $V_{HSN}$, $V_{HSP}$, $V_{LSP}$ and $V_{LSN}$ into one signal that can be processed by the ADC. The high side voltages $V_{HSP}$ and $V_{HSN}$ will vary around a positive supply voltage vddp. The low-side sense voltages $V_{LSP}$ and $V_{LSN}$ will vary around ground level, which is the reference node. The ADC will receive an input current $I_{OUT}$ at a voltage level around half the supply voltage of the ADC. This means that analog voltage level shifting is part of the function. Furthermore, the high-side sense voltages share a common vddp voltage. Some kind of differential amplifier could be used to reject the supply modulations.

The inputs voltages $V_{HSP}$, $V_{HSN}$, $V_{LSP}$, and $V_{LSN}$ connect to the four sense resistors. In absence of load current, $V_{HSP}$ and $V_{HSN}$ will be equal to the voltage of the power stage supply, vddp, and $V_{LSP}$ and $V_{LSN}$ will be equal to ground. The four conversion resistors called $R_{SUM,HSP}$, $R_{SUM,HSN}$, $R_{SUM,HLP}$, and $R_{SUM,HLN}$ are equal. Outputs $I_{OP}$ and $I_{ON}$ are differentially shorted by the first integrator of the sigma-delta loop of the ADC. That implies that any current leaving the $I_{OP}$ node will return via the $I_{ON}$ node. The mathematical function to be fulfilled by the circuit of FIG. 6 is:

$$I_{OUT}=(V_{HSP}-V_{HSN}-V_{LSP}+V_{LSN})/R_{SUM}$$

Addition and subtraction happens on the output nodes and in the current domain thanks to Kirchhoff's first law. As said, the common mode loop circuit 610 will measure the common mode voltage at nodes $I_{OP}$ and $I_{ON}$ and control the gates of $M_1$ and $M_2$ in-phase until the common mode voltage equals an external reference voltage, $V_{REF,CM}$. This means that the currents through $R_{SUM,LSP}$ and $R_{SUM,LSN}$ are both equal to $V_{REF,CM}/R_{SUM}$. These currents will also flow in $R_{SUM,HSP}$ and $R_{SUM,HSN}$ and, as a consequence, the external reference voltage will also drop across those high-side resistors. An additional high-side reference voltage is no longer needed. Excess voltage (since vddp is relatively large) will drop across cascode transistors $M_1$ and $M_2$. Depending on the maximum supply voltage, these may have to be high-voltage type. The differential mode loop circuit 630 will measure the difference between voltage $V_{S1}$ and voltage $V_{S2}$ and adjust that difference to zero by controlling the gate voltages of $M_1$ and $M_2$ in opposite phase. An advantage of this circuit is that the entire voltage headroom between the common mode output voltage and ground will drop across the four conversion resistors called $R_{SUM,HSP}$, $R_{SUM,HSN}$, $R_{SUM,HLP}$, and $R_{SUM,HLN}$. This is the optimum situation for noise within a given current budget. If a cascode transistor would be placed in between the top legs of the conversion resistors and the current outputs, and if the same branch current would have to be maintained, the resistor would have to be smaller to allow the voltage drop across the cascode. A smaller resistor gives more current noise.

Figure 7:
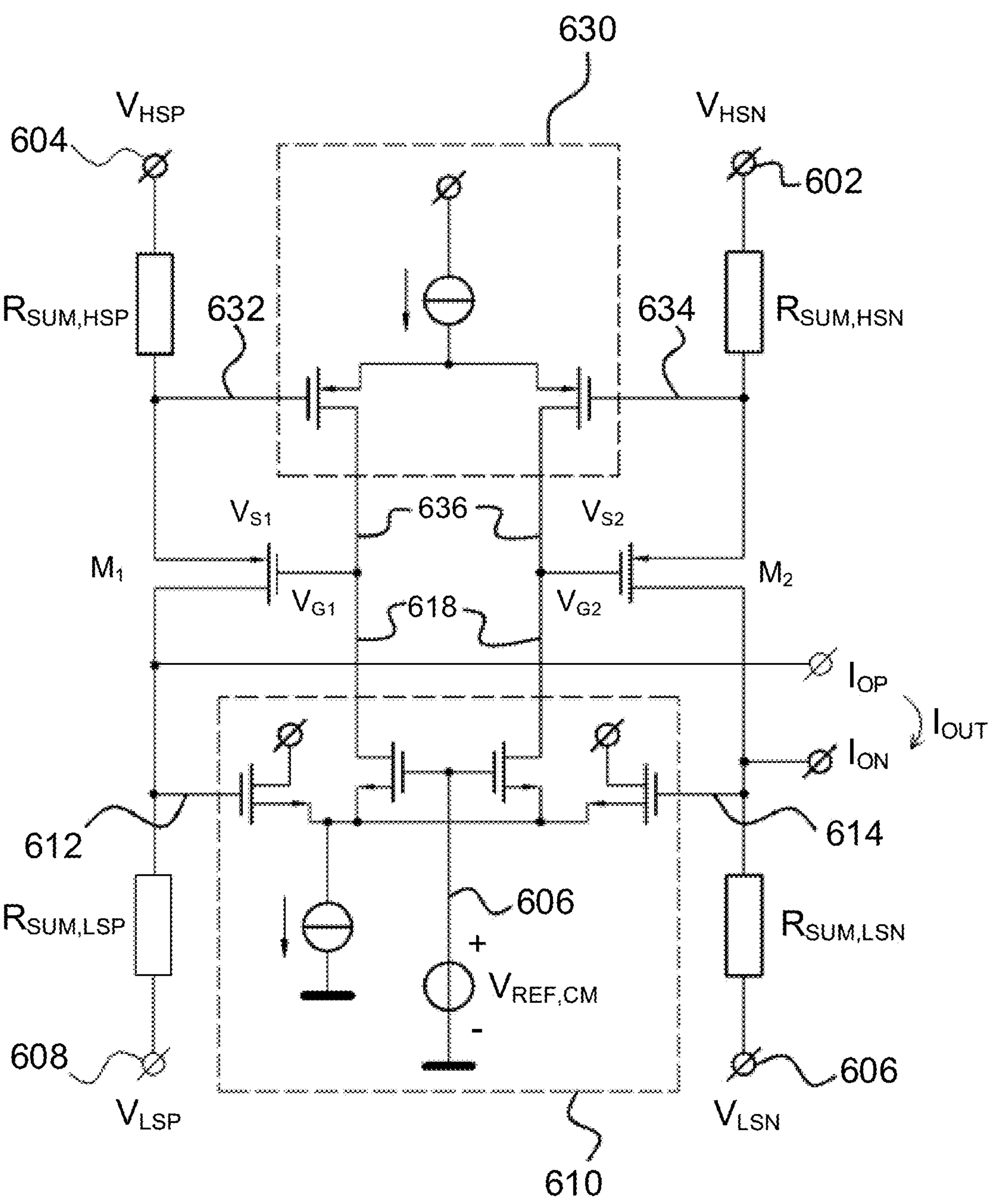
FIG. 7 shows an implementation of the current sense circuit of FIG. 6.
Figure 8:
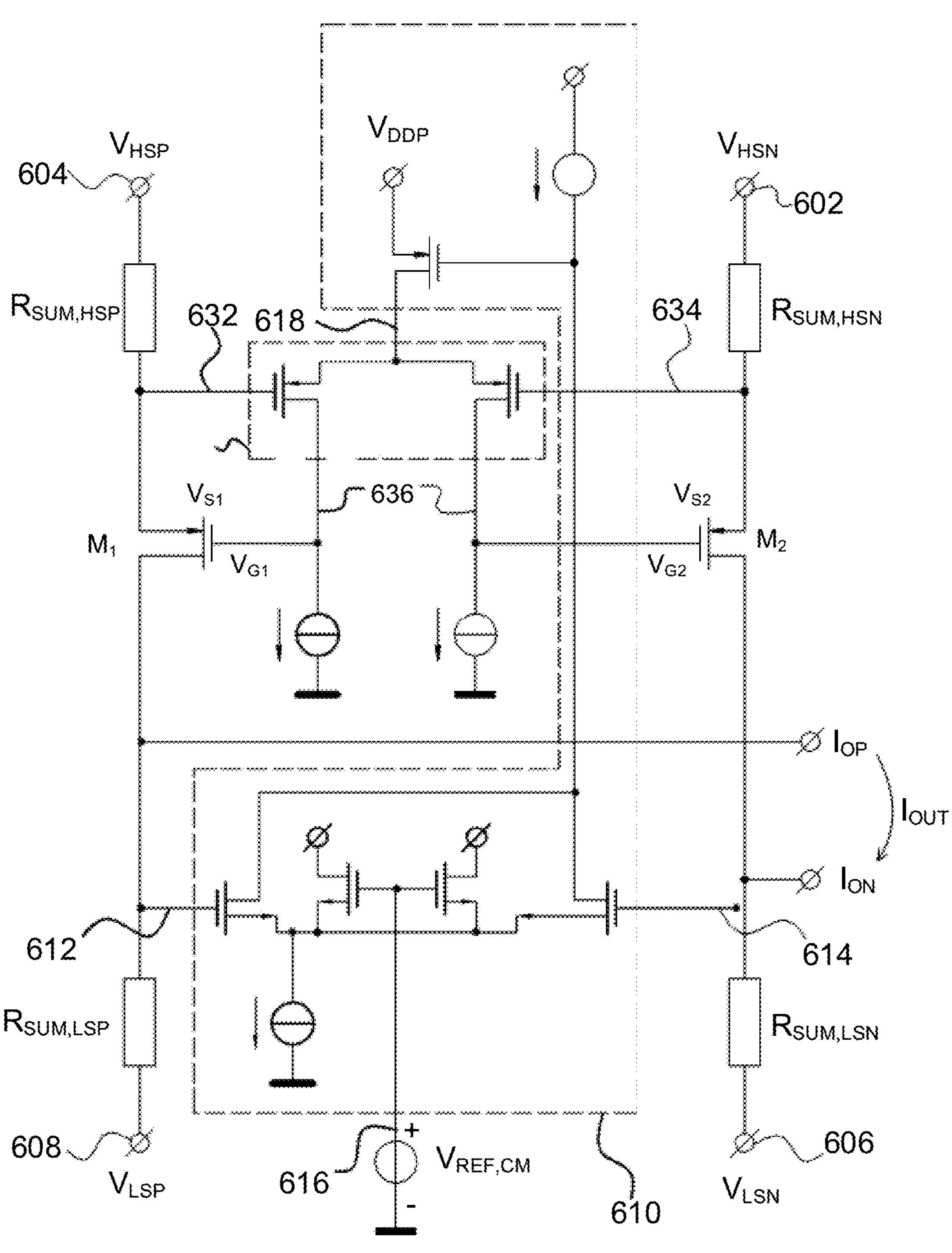
FIG. 8 shows an implementation of a current sense circuit according to an embodiment of the application.

FIGS. 7 and 8 show implementations of the current sense circuit of FIG. 6 using transistors. The only contributors to differential output current noise are resistors and the differential pair. In FIG. 8, instead of controlling the gates of $M_1$ and $M_2$ directly, they are controlled in-phase by adjusting the tail current source of the differential mode loop differential pair. The common-mode loop has become a two-stage amplifier in this way, which increases the loop gain for that loop.

Figure 9:
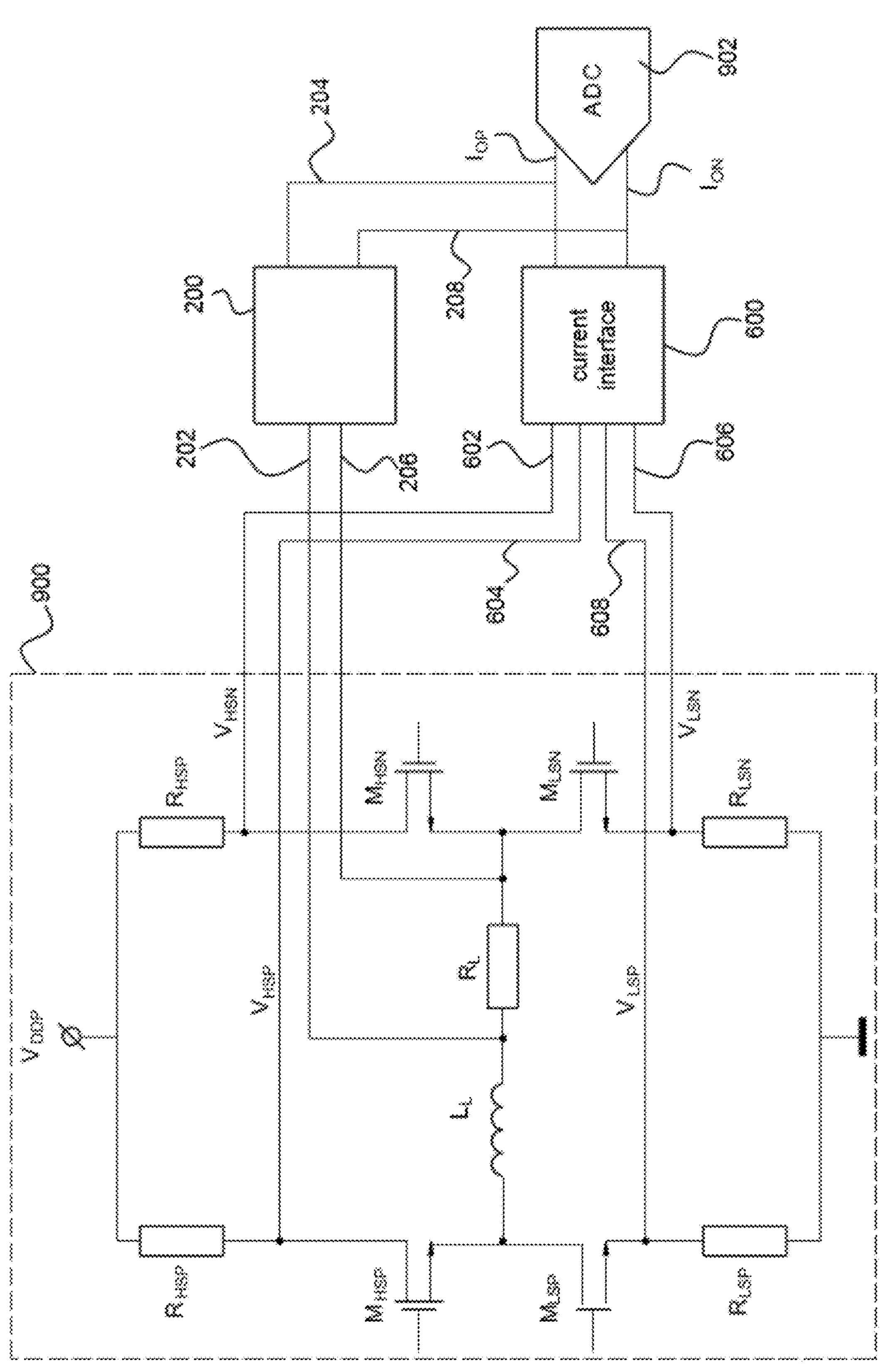
FIG. 9 shows a power amplifier comprising a current sense circuit and a voltage sense circuit according to the application.
Figure 10:
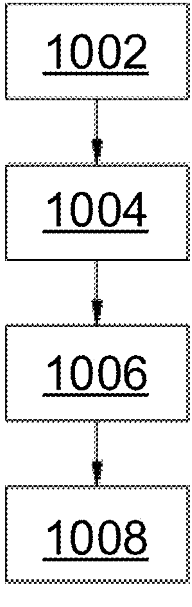
FIG. 10 shows a flowchart for a method of operating a voltage sense circuit.

FIG. 9 shows a power amplifier 900 comprising a current sense circuit 600 and a voltage sense circuit 200 according to the application. FIG. 9 also shows an ADC 902 connected at the output of the current sense circuit 600 and the voltage sense circuit 200. FIG. 10 shows a flowchart for a method of operating a voltage sense circuit for measuring a load connected to a power amplifier wherein the load is configured to receive a first voltage $V_{ip}$ at a first end and a second voltage $V_{in}$ at a second end, wherein the first and the second voltages are in opposite phase. The method comprises: step 1002 comprising receiving, at an input of a first voltage divider circuit 220 of the voltage sense circuit, the first voltage $V_{ip}$. The method further proceeds to step 1004 by receiving, at an input of a second voltage divider circuit 222 of the voltage sense circuit, the second voltage $V_{in}$. In step 1006, the method comprises receiving, at a first input 234 of a driver circuit 232 of the voltage sense circuit, a reference voltage, and receiving, at a second input 236 of the driver circuit 232, a common mode signal from the first and the second voltage divider circuits. Finally the method comprises step 1008 comprising driving, by the driver circuit, an output common mode voltage of the first and the second voltage divider circuits with the reference voltage.

Figure 11:
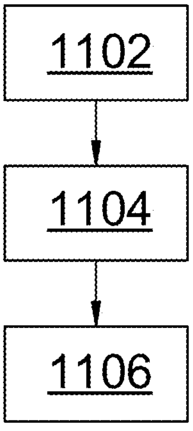
FIG. 11 shows a flowchart for a method of operating a current sense circuit.

FIG. 11 shows a flowchart for a method of operating a current sense circuit for measuring a load connected to a power amplifier wherein the load is configured to receive a first voltage $V_{ip}$ at a first end and a second voltage $V_{in}$ at a second end, wherein the first and the second voltages are in opposite phase. The method comprises a step 1102 of receiving, at a first input terminal 602, a first voltage $V_{HSN}$, receiving at a second input terminal 604, a second voltage $V_{HSP}$, receiving, at a third input terminal 606, a third voltage $V_{LSN}$ and, receiving, at a fourth input terminal 608, a fourth voltage $V_{LSP}$. The method further comprises a step 1104 of receiving, at first and second inputs of a common mode loop circuit 610, a common mode voltage at an output of the current sense circuit, and receiving, at a third input of the common mode loop circuit 610, a reference voltage. Finally, the method comprises a step 1106 of generating, at the output of the common mode loop circuit 610, a control signal 636 to switch the current sense circuit 600 such that the common mode voltage equals the reference voltage.

The examples and embodiments described herein serve to illustrate rather than limit the application. The person skilled in the art will be able to design alternative embodiments without departing from the scope of the claims. Reference signs placed in parentheses in the claims shall not be interpreted to limit the scope of the claims. Items described as separate entities in the claims or the description may be implemented as a single hardware or software item combining the features of the items described.

What is claimed is:

1. A voltage sense circuit for measuring a load connected to a power amplifier wherein the load is configured to receive a first voltage at a first end and a second voltage at a second end, wherein the first and the second voltages are in opposite phase, wherein the voltage sense circuit comprises:

a first input terminal coupled to the first voltage;

a second input terminal coupled to the second voltage;

a first output terminal;

a second output terminal;

a first voltage divider circuit comprising an input coupled to the first input terminal and an output coupled to the first output terminal;

a second voltage divider circuit comprising an input coupled to the second input terminal and an output coupled to the second output terminal; and a driver circuit comprising a first input configured to receive a reference voltage, a second input configured to receive a common mode signal from the first and the second voltage divider circuits, and an output configured to drive an output common mode voltage of the first and the second voltage divider circuits with the reference voltage;

wherein the driver circuit comprises a first resistor and a second resistor, a first end of the first resistor is connected to the first output terminal, a second end of the first resistor is connected to a first end of the second resistor, a second end of the second resistor is connected to the second output terminal, and the second input of the driver circuit is connected to the first end of the first resistor and the second end of the second resistor.

2. The voltage sense circuit according to claim 1, wherein the second input of the driver circuit is connected to the output of the driver circuit.

3. The voltage sense circuit according to claim 1, wherein each of the first and second voltage dividers comprises a pair of resistors wherein each of the pair of resistors comprises a first end and a second end and wherein the first ends of the pair of resistors are respectively connected to the first and second output terminals and wherein the second ends of the pair of resistors are connected to each other.

4. The voltage sense circuit according to claim 3, wherein the second input and the output of the driver circuit are connected to the second ends of the pair of resistors.

5. The voltage sense circuit according to claim 1, wherein the first voltage divider circuit comprises a first and a second voltage dividing resistors; wherein the first voltage dividing resistor comprises a first end and a second end and the second voltage dividing resistor comprises a first end and a second end; wherein the first end of the first voltage dividing resistor is coupled to the first input terminal of the voltage sense circuit, the second end of the first voltage dividing resistor is coupled to the first end of the second voltage dividing resistor and the first end of the first resistor.

6. The voltage sense circuit according to claim 5, wherein the driver circuit second voltage divider circuit further comprises a third voltage dividing resistor and a fourth voltage dividing resistors; wherein the third voltage dividing resistor comprises a first end and a second end, and the fourth voltage dividing resistor comprises a first end and a second end; wherein the first end of the third voltage dividing resistor is connected to the second input terminal, the second end of the third voltage dividing resistor is connected to the second end of the second resistor and to the first end of the fourth voltage dividing resistor; the second end of the fourth voltage dividing resistor is connected to the second input of the driver circuit and to the second end of the second voltage dividing resistor.

7. The voltage sense circuit according to claim 6, wherein the second end of the first voltage dividing resistor is coupled to the first output terminal of the voltage sense circuit;

the driver circuit comprises an operational amplifier, a non-inverting input of the operational amplifier is connected to the first input terminal of the driver circuit, an inverting input of the operational amplifier is connected to the second end of the second voltage dividing resistor and to the second end of the fourth voltage dividing resistor, an output of the operational amplifier is connected to the second end of the first resistor and to the first end of the second resistor;

wherein the inverting input of the operational amplifier is connected to the second input terminal of the driver circuit.

8. The voltage sense circuit according to claim 1, wherein the driver circuit further comprises a first and a second output resistors, wherein the first output resistor is connected between the first output terminal and the first end of the first resistor and the second output resistor is connected between the second output terminal and the second end of the second resistor.

9. The voltage sense circuit according to claim 8, wherein the first output resistor of the driver circuit comprises a first end and a second end and the second output resistor of the driver circuit comprises a first end and a second end; wherein the second end of the first output resistor of the driver circuit is connected to the first output terminal and the first end of the first output resistor of the driver circuit is connected to the first end of the first resistor, the second end of the second output resistor of the driver circuit is connected to the second output terminal and the first end of the second output resistor of the driver circuit is connected to the first end of the second resistor.

10. The voltage sense circuit according to claim 9, wherein the driver circuit comprises an operational amplifier, a non-inverting input of the operational amplifier is connected to the first input terminal of the driver circuit, an inverting input of the operational amplifier is connected to the second end of the second voltage dividing resistor and to the second end of the fourth voltage dividing resistor, an output of the operational amplifier is connected to the second end of the first resistor and to the first end of the second resistor;

wherein the inverting input of the operational amplifier is connected to the second input terminal of the driver circuit.

11. The voltage sense circuit according to claim 8, wherein the first output terminal and the second output terminal of the voltage sense circuit are coupled together.

12. The voltage sense circuit according to claim 1, wherein the driver circuit comprises an operational amplifier, and wherein a non-inverting input of the operational amplifier is connected to the first input of the driver circuit, wherein an inverting input of the operational amplifier is connected to the second input terminal of the driver circuit, and wherein an output of the operational amplifier is connected to the second end of the first resistor and to the first end of the second resistor.

13. The voltage sense circuit according to claim 1, wherein the driver circuit comprises a third input terminal coupled to a third voltage, a fourth input terminal coupled to a fourth voltage, and a common mode loop circuit.

14. The voltage sense circuit according to claim 13, wherein the common mode loop circuit comprises a first input, a second input, a third input and an output; wherein the first and the second inputs of the common mode loop circuit are respectively configured to receive a common mode voltage at the first and second output terminals, the third input is configured to receive the reference voltage.

15. A current sense circuit for measuring a load connected to a power amplifier wherein the load is configured to receive a first voltage at a first end and a second voltage at a second end, wherein the first and the second voltages are in opposite phase, wherein the current sense circuit comprises:

a first input terminal coupled to the first voltage;

a second input terminal coupled to the second voltage;

a third input terminal coupled to the third voltage;

a fourth input terminal coupled to the fourth voltage;

a first output terminal;

a second output terminal; and a common mode loop circuit comprising a first input, a second input, a third input and an output wherein the first and the second inputs are configured to receive a common mode voltage at the first and second output terminals, the third input is configured to receive a reference voltage, and to generate a control signal at the output to switch the current sense circuit such that the common mode voltage equals the reference voltage;

wherein the current sense circuit further comprising a first, second, third and fourth conversion resistors comprising a first end and a second end, the first end of the first, second, third and fourth conversion resistors are respectively coupled to the first, second, third and fourth input terminals.

16. The current sense circuit according to claim 15, further comprising a differential mode loop circuit comprising a first input and a second input and an output wherein the first and the second inputs are configured to receive a voltage difference and generate a control signal to reduce the voltage difference.

17. The current sense circuit according to claim 16 further comprising a first transistor comprising a source, a gate and a drain, a second transistor comprising a source, a gate and a drain, the second end of the second conversion resistor is coupled to the first input of the differential mode loop circuit and to the source of the first transistor, the second end of the first conversion resistor is coupled to the second input of the differential mode loop circuit and to the source of the second transistor, the second end of the fourth conversion resistor is coupled to the first input of the common mode loop circuit and to the drain of the first transistor, the second end of the third conversion resistor is coupled to the second input of the common mode loop circuit and to the drain of the second transistor, and the control signals generated by the common mode loop circuit and the differential mode loop circuit control the gates of the first transistor and the second transistor.

18. The current sense circuit according to claim 16 wherein the differential mode loop circuit comprises a differential amplifier circuit.

19. The current sense circuit according to claim 15 wherein the common mode loop circuit comprises a couple of differential amplifier circuits.

20. A method of operating a voltage sense circuit for measuring a load connected to a power amplifier wherein the load is configured to receive a first voltage at a first end and a second voltage at a second end, wherein the first and the second voltages are in opposite phase, the method comprising the steps of:

receiving, at an input of a first voltage divider circuit of the voltage sense circuit, the first voltage;

receiving, at an input of a second voltage divider circuit of the voltage sense circuit, the second voltage;

receiving, at a first input of a driver circuit of the voltage sense circuit, a reference voltage, and receiving, at a second input of the driver circuit, a common mode signal from the first and the second voltage divider circuits; and driving, by the driver circuit, an output common mode voltage of the first and the second voltage divider circuits with the reference voltage;

wherein the driver circuit comprises a first resistor and a second resistor, a first end of the first resistor is connected to the first output terminal, a second end of the first resistor is connected to a first end of the second resistor, a second end of the second resistor is connected to the second output terminal, and the second input of the driver circuit is connected to the first end of the first resistor and the second end of the second resistor.

* * * * *